United States Patent [19]

Biswas

[11] Patent Number: 4,627,678

[45] Date of Patent: Dec. 9, 1986

[54] ELECTRONIC PACKAGE ASSEMBLY AND ACCESSORY COMPONENT THEREFOR

[75] Inventor: Ranjit Biswas, Plainsboro, N.J.

[73] Assignee: Thomas & Betts Corporation, Raritan, N.J.

[21] Appl. No.: 703,259

[22] Filed: Feb. 20, 1985

Related U.S. Application Data

[63] Continuation-in-part of Ser. No. 460,434, Jan. 24, 1983, Pat. No. 4,519,658.

[51] Int. Cl.[4] ............................................ H01R 9/09

[52] U.S. Cl. ............................................ 339/17 CF

[58] Field of Search ............... 339/17 CF, 18 R, 18 C

[56] References Cited

U.S. PATENT DOCUMENTS

| | | | |
|---|---|---|---|
| 3,138,754 | 6/1964 | Roessler, Jr. | 339/17 L |
| 3,277,347 | 10/1966 | Ecker | 339/17 E |
| 3,349,162 | 10/1967 | Eckhardt | 361/401 |
| 3,880,493 | 4/1975 | Lockhart, Jr. | 339/147 |
| 3,912,984 | 10/1975 | Lockhart, Jr. et al. | 339/17 CF |
| 3,999,826 | 12/1976 | Yurtin | 339/17 F |
| 4,012,093 | 3/1977 | Crane | 339/17 F |
| 4,116,519 | 9/1978 | Grabbe et al. | 339/17 CF |
| 4,356,532 | 10/1982 | Donaher et al. | 361/393 |
| 4,444,063 | 4/1984 | Snowden et al. | 364/506 |
| 4,475,143 | 10/1984 | Hernandez | 361/306 |
| 4,494,169 | 1/1985 | Watson | 361/306 |
| 4,494,170 | 1/1985 | Schilling | 361/306 |
| 4,497,012 | 1/1985 | Gottlieb | 361/321 |
| 4,499,519 | 2/1985 | Fishman | 361/306 |

FOREIGN PATENT DOCUMENTS

| | | | |
|---|---|---|---|
| 464556 | 8/1975 | Australia . | |
| 1188520 | 4/1970 | United Kingdom | 339/17 F |

OTHER PUBLICATIONS

Insulation/Circuits, Dec. 1982, p. 98.

*Primary Examiner*—Neil Abrams

*Attorney, Agent, or Firm*—Robert M. Rodrick; Salvatore J. Abbruzzese

[57] ABSTRACT

An accessory circuit component for an electrical package is disclosed. This circuit component includes a conductive path for connecting an accessory component to selected contacts of the electrical package. The conductive path includes portions thereof which are selectively removable to create an open electrical circuit between the selected package contacts.

6 Claims, 8 Drawing Figures

ELECTRONIC PACKAGE ASSEMBLY AND ACCESSORY COMPONENT THEREFOR

This application is a continuation-in-part of application Ser. No. 460,434 filed Jan. 24, 1983 now U.S. Pat. No. 4,519,658.

FIELD OF THE INVENTION

The present invention relates generally to electronic package assemblies and, more particularly, to accessory circuit components for electrical interconnection with electronic packages in such assemblies.

BACKGROUND OF THE INVENTION

Dual-in-line packages (DIP) have found wide use as a means of providing a mounting and interconnection for a variety of integrated circuits. In microelectronics circuits employing a plurality of DIPs, severe noise transients can arise in the power supply circuit due to the very fast switching times of some circuits. One method of preventing the coupling of this undesired high frequency interference into the rest of the circuit is to use low pass filters between the common power supply and the leads attached to the DIPs.

To effect such decoupling, it had been common practice to assemble capacitors on the printed circuit board and then connect such capacitors by conductive traces to the DIP leads corresponding to the power supply connection and ground pins. This procedure has been found to be disadvantageous for at least two reasons. First, it is wasteful of space as the discrete capacitive components are spread out on the printed circuit board and, second, the inductance of the connective conductive traces can nullify the effect of the capacitor in the circuit.

To overcome these disadvantages, the more current art has seen efforts in combining the decoupling capacitor to the DIP or to sockets for joining the DIPs to printed circuit boards. For example, in U.S. Pat. No. 3,880,493 issued to Lockhart, Jr. on Apr. 29, 1975, a decoupling capacitor is encapsulated in the body of a socket for interconnecting a DIP and a printed circuit board. Another example is shown in U.S. Pat. No. 3,912,984 issued to Lockhart, Jr., et al. on Oct. 14, 1975 where an auxiliary circuit package containing a decoupling capacitor is designed to occupy the open space between the rows of terminals of a DIP, the contacts of the auxiliary package and the terminals of the DIP being located simultaneously in contact with sockets on a printed circuit board. A further example is disclosed in commonly-owned U.S. Pat. No. 4,356,532 issued to Donaher, et al. on Oct. 26, 1982 wherein a substrate supporting capacitive components is connected by conductive traces thereon to the contact elements in a DIP receiving receptacle.

While all these current approaches minimize the areas on the printed circuit boards for connection of the decoupling components, they present other disadvantages. In the '493 patent, the encapsulation of the capacitor in the socket prevents ease of maintenance or repair of such component circuit, requiring a costly discarding of the entire socket if replacement is necessary. In the '984 patent, unnecessary terminals of the auxiliary package are provided and means for orienting such terminals relative to the contacts of the DIP is required. In the '532 patent, connection of the planar ear portions of the substrate to surfaces other than flat contact surfaces may provide difficulty in achieving a suitable connection.

Accordingly, it is desirable to provide a technique for interconnecting a decoupling component that not only minimizes real estate on a printed circuit board but is low cost and easy to handle and interconnect.

SUMMARY OF THE INVENTION

It is an object of the present invention to provide an improved accessory circuit component for electrical connection to an electrical package.

A more particular object of the invention is to provide an electrical assembly interconnecting such accessory component to the contacts of an electrical package.

In accordance with the invention, an accessory circuit comprises a flexible substrate which includes a conductive path connectable between a contact pin of an electrical package and an accessory component mounted on the substrate. Portions of the conductive path are selectively removable to electrically isolate the accessory component from the conductive pin.

In the preferred embodiment, a conductive pattern is supported on a flexible dielectric sheet for attachment to the electrical package

DETAILED DESCRIPTION OF THE PREFERRED EMBODIMENT

Figure 1:
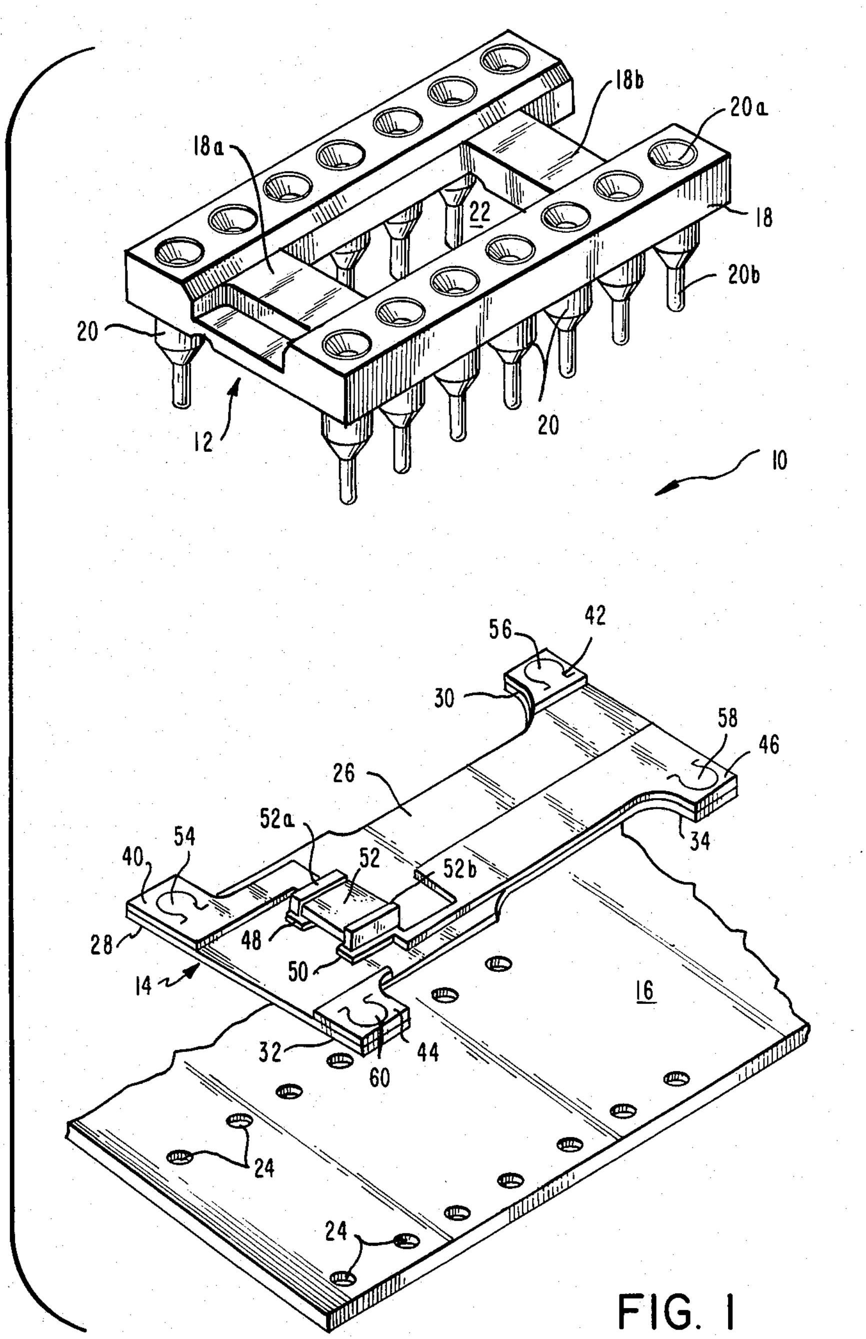
FIG. 1 is an exploded perspective view of the accessory circuit component of the present invention, in assembly with a suitable dual-in-line package socket and a printed circuit board of the types with which the invention may be used.

Referring to FIG. 1, an assembly 10 of an electrical socket 12 for receipt of a dual-in-line package (DIP) and an accessory circuit component 14 are interconnected to a printed circuit board 16. The DIP socket 12 includes a generally elongate body 18 of dielectric material supporting a plurality of substantially identical electrical contacts 20. The contacts 20, each having an upper receptacle 20*a* and a lower, depending pin 20*b*, are arranged in two laterally spaced, longitudinally extending rows in the body 18. The socket body 18 includes a pair of longitudinal spaced frame members 18*a* and 18*b* defining therebetween an opening 22. Although the socket 12 is depicted as having fourteen contacts 20, it should be appreciated that sockets having desirably more or less contacts are useful in the practice of the invention.

Selected contacts 20 of the socket 12, for example, the four corner contacts, are electrically interconnected to the accessory circuit component 14 in a manner fully described hereinbelow, the contact pins 20*b* projecting through the circuit component 14 and adapted to enter apertures 24 extending through the printed circuit board 16, such apertures 24 being spaced in corresponding relation to the arrangement of the socket contacts 20. Such interconnection electrically connects the socket contacts 20, the accessory circuit component 14 and suitable circuits or devices (not shown) disposed on the printed circuit board 16.

Figure 2:
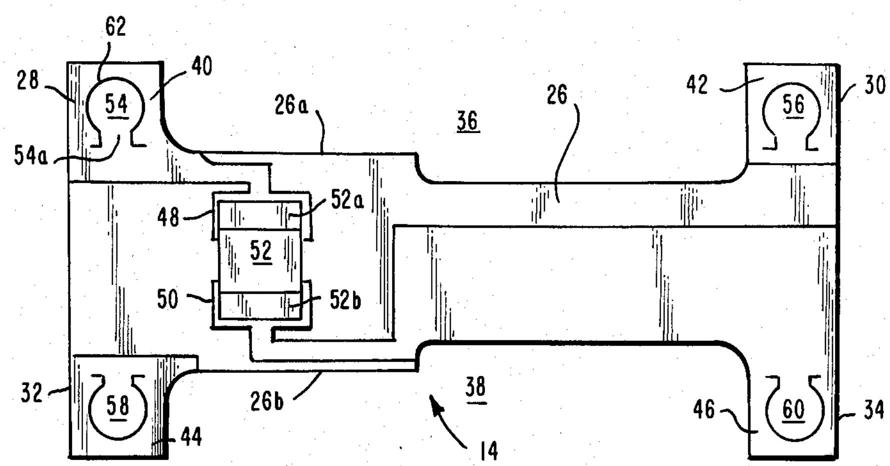
FIG. 2 is a top plan view of the accessory circuit component of FIG. 1.

With reference still to FIG. 1 and also now to FIG. 2, the details of the accessory circuit component may be more completely described. The component 14 includes a thin, flexible substrate 26 of dielectric material. Substrate 26 is preferably formed from a sheet of polyimide on the order of several thousandths of an inch in thickness. In the preferred configuration, the substrate 26 is generaly elongate, having laterally spaced side margins 26*a* and 26*b*. Spaced longitudinally at each end of the substrate are ear portions 28, 30, 32 and 34, each projecting laterally outwardly of the respective side margins 26*a* and 26*b*. Ear portions 28 and 30 define therebetween a cutout portion 36 while ear portions 32 and 34 define therebetween a cutout portion 38, the purposes of such cutout portions being described hereinbelow.

Disposed on the substrate 26 is a manner conventional in the art is a printed circuit of conductive traces. At least one conductive trace is provided in secured registry with each ear portion. Accordingly, conductive traces 40, 42, 44 and 46 are disposed on ear portions 28, 30, 32 and 34, respectively. Trace 40 is connected to a conductive pad 48 and trace 46 is connected to a conductive pad 50, pads 48 and 50 being spaced from each other. A decoupling capacitor 52 is supportively interconnected between traces 40 and 46, one capacitor terminal 52*a* being connected to pad 48 and another capacitor terminal 52*b* being connected to pad 50. It should be appreciated that other devices, inclusive of active and passive elements may be used in the accessory circuit component 14.

At each of the ear portions, a deflectable tab is provided, tabs 54, 56, 58 and 60 being in registry with ear portions 28, 30, 32 and 34, respectively. Each of the tabs (described only with reference to tab 54 for the sake of brevity as all the tabs asre substantially identical) is defined by a slot or cut 62 that extends through both the conductive trace 40 and the ear portion 28. The cut 62, provided by stamping or other suitable techniques, defines a curved path that is generally D-shaped and traverses nearly a complete loop, an extent 54*a* of both the trace 40 and the ear portion 28 being left uncut. The uncut extent 54*a* provides a hinge adjacent the cut 62 about which the tab 54 can bend or deflect. In the preferred arrangement, the tabs are all located within the interior side margins of the ear portions and substrate. It should be understood that the tabs may have different configurations, such as, for example, a tab defined by two substantially parallel cuts, each extending through a peripheral edge of the substrate or the tab may be defined by a generally H-shaped cut fully interiorly of the side margins of the substrate providing effectively two facing deflectable tab portions.

Figure 3:
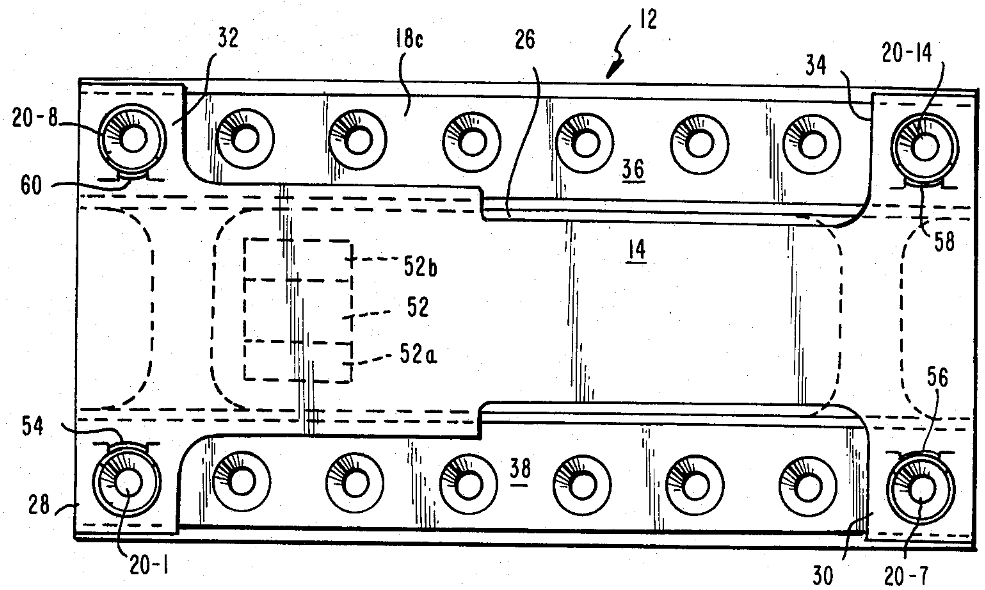
FIG. 3 is a bottom plan view of the assembly of the accessory circuit component and the electrical socket of FIG. 1.
Figure 4:
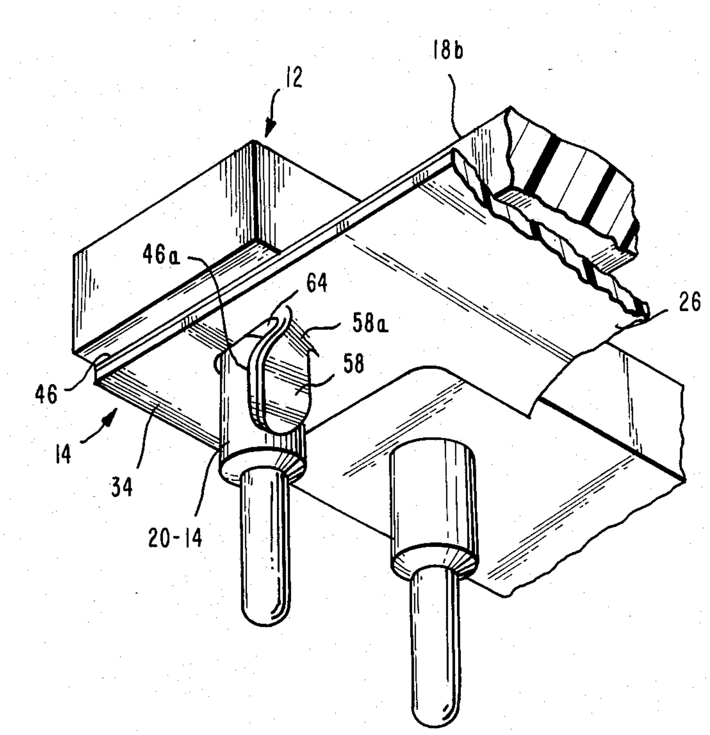
FIG. 4 is a bottom fragmentary perspective view of the assembly of the accessory circuit component and the electrical socket looking at the lower right hand corner of FIG. 1 from the bottom of the assembly.

With reference now to FIGS. 3 and 4, the assembly of the accessory circuit component 14 and the socket 12 is described. During assembly, the four corner pins of the socket contacts 20 are aligned with the tabs 54, 56, 58 and 60 on the substrate, the contact pins being urged against the tabs to cause such tabs to deflect in tongue-like manner, thereby providing an opening, for example, opening 64 in ear portion 34 as shown in FIG. 4, through which the contacts extend. The tab 58, for example, bends downwardly about its hinge 58*a*, as contact 20-14 is inserted through the opening 64, a portion 46*c* of the conductive trace bearing against the outer surface of the contact 20-14. In the assembled condition, the tabs project downwardly from the substrate in substantially orthogonal relation thereto.

The opening 64, as defined by the cut through the conductive trace 46 and ear portion 34, fully circumscribes the contact 20-14 and as the opening is configured to have relatively close clearance about the contact 20-14, desirably good location and orientation of the substrate 26 relative to the contacts are achieved. The conductive trace portion 46*a* of the tab 58 is connected to the contact by soldering, but other suitable joining means such as welding, may also be used.

In FIG. 3, the assembly of the socket 12 and the accessory circuit component 14 is seen from the bottom. The substrate 26 is secured preferably against the undersurface 18*c* of the socket body in substantially parallel relation thereto. The capacitor 52 resides in the opening 22 (FIG. 1) between the body frame members 18*a* and 18*b* so as to minimize the profile of the assembly. The capacitor terminal 52*a* is connected through trace 40 to contact 20-1, which may be designated as a power pin, while capacitor terminal 52*b* is connected through trace 46 to contact 20-14, which may be designated as a ground pin. Contacts 20-7 and 20-8 which are attached to tabs 56 and 60, respectively, are not electrically connected in the preferred arrangement to the capacitor, these connections providing mechanical support for the substrate 26. It can also be seen that, in assembly, the side cutout substrate portions 36 and 38 provide clearance about the non-connected contacts 20.

Figure 5:
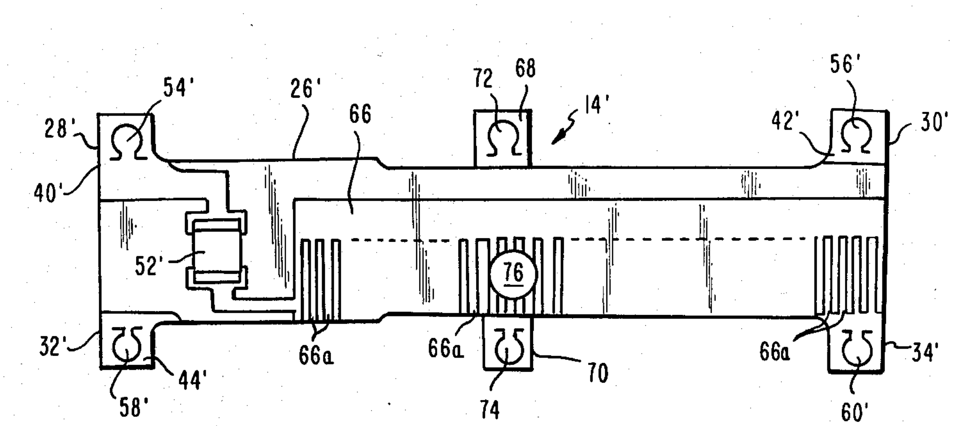
FIG. 5 is a top plan view of a particular form of the accessory circuit component in accordance with a preferred arrangement.

Having described a preferred form of the invention, it can be appreciated that advantages over the known component decoupling techniques are achieved in ease of handling, location and orientation of the assembly parts, as well as in space-saving and height. The construction of the accessory circuit component also lends itself to ease of fabrication to sockets of different contact arrangements, for example, of 16, 18 or 20 contacts. In assemblies of larger socket sizes and more contacts, as the accessory circuit component is flexible, if the corner contacts are connected to the substrate, there may be a tendency for the substrate to sag in the center. Accordingly, intermediate connections would desirably be made. FIG. 5, a modified form of the accessory circuit component is illustrated, which may be used in interconnections with larger sockets while also providing a degree of selectability for contact connections. Accessory circuit component 14′ is formed similar to component 14 having a substrate 26′ with ear portions 28′, 30′, 32′ and 34′ with tabs 54′, 56′, 58′ and 60′ in registry therewith. A capacitor 52′ is suitably connected to conductive trace 40′ and to a conductive trace 66.

In this modified version, two further ear portions 68 and 70 are provided with suitable deflectable tabs 72 and 74, ear portion 68 being disposed between ear portions 28′ and 30′ and ear portion 70 being disposed between ear portions 32′ and 34′. Conductive trace 66 includes a plurality of spaced trace elements 66a extending in grid-like manner longitudinally along the substrate 26′ such that, through elements 66a, the trace 66 is in registry and electrical connection with both tabs 60′ and 74. In addition to providing mechanical support of the substrate 26′ in assembly with a socket, selective electrical connection of socket contacts is provided. For example, as shown in FIG. 5, an open electrical path between tab 74 and trace 66 is provided by severing the trace elements 66a adjacent the ear portion 70 by punching an aperture 76 through the elements 66a and underlying substrate 26′ so as to electrically isolate the trace 66 and the tab 74. An electrical path between tab 60′ and conductive trace 66 is provided by the elements 66a thereat which remain whole and unsevered. Of course, the selection may be reversed wherein tab 74 is electrically connected with trace 66 while tab 60′ is isolated electrically therefrom.

Figure 6:
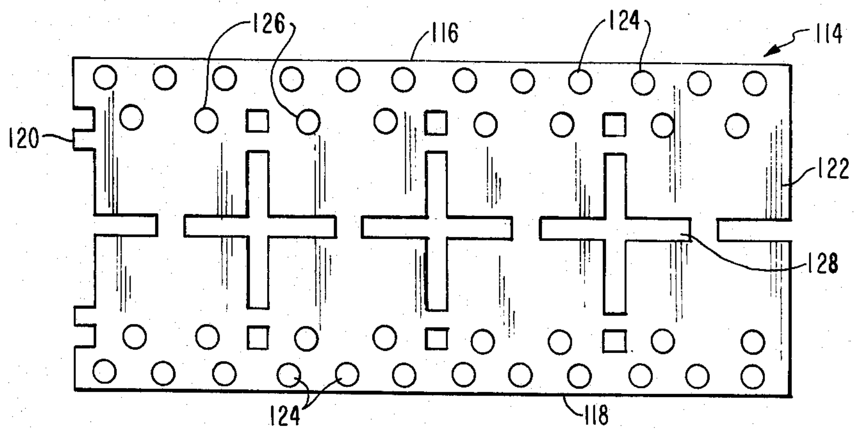
FIG. 6 is a top plan view of a further preferred embodiment of the accessory circuit component of the present invention
Figure 7:
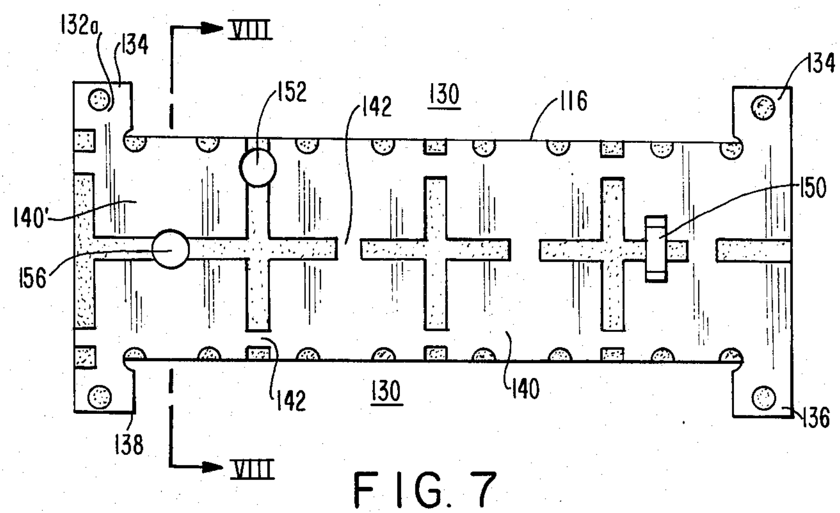
FIG. 7 shows the accessory circuit component of FIG. 6 supported on a dielectric substrate for attachment to an electrical package.
Figure 8:
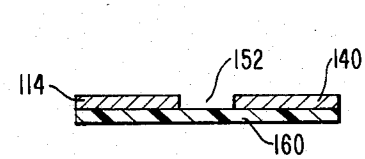
FIG. 8 is a cross-section of the circuit of FIG. 7 through the lines VIII—VIII.

A further preferred embodiment of the present invention is illustrated in FIGS. 6–8. This embodiment is especially useful in providing connection between plural decoupling capacitors and selected pins of the electrical package. The embodiment shown in FIGS. 6–8 also allows for connection at multiple voltage levels.

The accessory component circuit 114 shown in FIG. 6 is formed from a continuous strip of copper which has been overlayed on one side with tin. Circuit 114 is an elongate rectangular planar member having a pair of opposed spaced longitudinal sides 116 and 118 and spaced transverse sides 120 and 122. Along each longitudinal side 116 and 118 of circuit 114 is a row of circular openings 124. The embodiment shown herein includes 10 openings 124 along each marginal longitudinal side 116 and 118. Each of openings 124 corresponds to and is arranged for alignment with a pin of electrical package 12 (FIG. 1). Therefor, circuit 114 is designed for use with a 20 pin package. Of course, it is understood that circuit 114 could be modified to accommodate packages with more or less pins.

Circuit 114 includes a second set of circular openings 126. Openings 126 are arranged in two rows each of which is spaced slightly transversely inwardly of the adjacent row of openings 124 along the respective longitudinal sides 116 and 118. Openings 126 are uniformly longitudinally spaced along circuit 114 and provide a perforated or frangable line, along which a portion of circuit 114, adjacent longitudinal sides 116 and 118 may be removed. The central portion of circuit 114 includes a pattern of cross-shaped openings 128 spaced and continuously extending longitudinally across circuit 114. A cross-shaped pattern of opening is shown by way of example, however, openings 128 may be of any suitable shape. As will be described hereinbelow, openings 126 and openings 128 provide a conductive path between the pins of package 12 and an accessory component mounted on circuit 114.

Now referring to FIG. 7, the circuit 114 is shown prepared for securement to package 12. A central portion 130 along each longitudinal side 116 and 118 has been selectively removed by blanking or similar removal method. The blanking is facilitated by openings 126 which serve as a score line along which central portion 130 can be removed. In the present illustrative embodiment, the full central regions 130 have been removed leaving ear portions 132, 134, 136 and 138, one at each corner of rectangular circuit 114, however, it is understood that the ear portions may be provided about any of openings 124 to provide a connection extent to attach to any of the pins of package 12.

Ear portion 132, for example, is formed in one corner of circuit 114 and includes a narrow-necked down transition portion 132a. The narrow portion is formed by one of openings 126. This narrow transition portion 132a serves as a heat restrictor as the narrow portion resists transference of heat from electrical current flow thereacross. Further, this narrow portion 132a provides strain relief, as the ear portion will more readily bend thereat, preventing damage to the main portion of circuit 114, upon inadvertent flexing of the circuit. As shown in FIG. 7. the removed central portion 130 and cross-shaped openings 128 form a conductive path among each of the selected ear portions 132–138. This conductive path comprises a plurality of land areas 140 which are interconnected to adjacent land areas by conductive bridges 142 formed between adjacent cross-shaped openings 128. These thin bridge portions 142 provide electrical continuity between ear portions 132–138.

As further shown in FIG. 7, an accessory component such as a capacitor 150 may be supported on circuit 114. Capacitor 150 is mechanically and electrially secured in a conventional manner to circuit 114. As shown, capacitor 150 is secured across one arm of a cross-shaped opening 128 to two adjacent lands 140. The present invention provides for connection selectively by permitting electrical isolation of one or more of ear portions 132–138 from the other of the ear portions and capacitor 150. Shown by way of example in FIG. 7, ear portion 132 can be electrically isolated from capacitor 150 by placing apertures 152 in the bridges 142 which connect land 140′, which supports ear portion 132 to its adjacent lands. Thus, there is no complete electrical path established between ear portion 132 and capacitor 150 as apertures 152 provide an open electrical path therebetween.

It can be appreciated that further ear portions can also be isolated in a similar manner. Further, multiple capacitors can be placed on circuit 114 with only certain ones of ear portions 132–138 connected to certain ones of the plural capacitors. Selectivity in this manner permits connection to pins of package 12 at multiple voltage levels.

In the preferred embodiment shown herein, circuit 114 is supported on a flexible dielectric substrate 160. As shown in FIG. 8, substrate 160 underlies circuit 114 and supports the entire circuit. While the substrate 160 is not electrically essential to the assembly, it does provide structural support which is desirable especially where several bridges 142 connecting circuit 114 are removed.

Various other modifications to the foregoing particularly described invention will now be evident to those skilled in the art. For example, while the accessory circuit component is interconnected with an electrical socket, it can be appreciated that such accessory component may also be directly attached to the leads of an electrical or electronic package, such as a DIP. Accordingly, the preferred embodiment as described herein is intended in an illustrative rather than a limiting sense. The true scope of the invention is set forth in the following claims.

I claim:

1. An accessory circuit for connection to an electrical package having an elongate housing and a plurality of extending contacts aligned along two transversely spaced longitudinally extending edges thereof, said circuit comprising:

a flat elongate planar conductive member having a plurality of openings aligned along two transversely spaced longitudinaly extending edges thereof for corresponding alignment with and receipt of said contacts of said package, said conductive member further including a plurality of apertures aligned in two transversely spaced longitudinally extending rows, substantially parallel to and spaced transversely inwardly from said openings, said apertures defining a connection region between said apertures and said longitudinal edges of said conductive members inclusive of said openings, portions of said connection region being selectively removable, to thereby define plural connection extents for engagement with plural selected contacts of said package, said conductive member further including a central region between said rows of apertures defining a conductive path between said central region and said connection extents, portions of said central region being selectively removable to create an open electrical circuit between said central region and said connection extents.

2. A circuit in accordance with claim 1 wherein said central region comprises plural land portions for supporting an accessory component for electrical connection with said contact of said package.

3. A circuit in accordance with claim 2 further comprising conductive bridges for electrically interconnecting said lands.

4. A circuit in accordance with claim 3 wherein said bridges are selectively removable to create said open circuits.

5. An accessory circuit of claim 1 wherein said conductive member is supported on a planar substrate.

6. An accessory circuit of claim 5 wherein said substrate is formed of a flexible dielectric material.

* * * * *